United States Patent Office 3,574,657
Patented Apr. 13, 1971

3,574,657

POLYMERIC IMAGES FORMED BY HEAT

Leo S. Burnett, Scarsdale, N.Y., assignor to FMC Corporation, New York, N.Y.

No Drawing. Filed Dec. 14, 1967, Ser. No. 690,399
Int. Cl. B44c *1/22;* C41n *1/08;* B44d *1/46*
U.S. Cl. 117—8 4 Claims

ABSTRACT OF THE DISCLOSURE

Polymeric images are formed by exposing a cured allylic resin coating to a heat pattern. The coating is removed in the heated areas leaving a cured polymeric image in the unheated areas. The resulting coating can be inked and used as a printing surface for producing printed copies.

BACKGROUND OF THE INVENTION

(A) Field of the invention

This invention relates to the production of polymeric images useful in printing processes. More particularly it pertains to forming such images by exposing a cured allylic resin coating to a heat pattern.

(B) Description of the prior art

In the photoreproduction art it is well known to produce polymeric images by subjecting a photopolymerizable compound to actinic radiation such as light or UV radiation. In a typical procedure, a base support is coated with a mixture of an ethylenically unsaturated compound and a sensitizing agent. The resulting coating is exposed to a light pattern whereby photopolymerization occurs in the irradiated areas. After removing the unpolymerized coating in the unexposed areas, there remains a photopolymerized image anchored to the support base. Such images can be dyed to form colored reproductions or used as a printing plate since the polymeric images are capable of accepting inks while the background areas can be rendered hydrophilic or ink-repellent.

SUMMARY OF THE INVENTION

With a view to seeking improvements in the production of polymeric images, I have now discovered that such entities can be produced by thermal means in which a heat pattern is applied to a cured allylic resin film whereby the film is removed in the heated areas while remaining intact in the unheated areas and the provision of such images including a method of producing them and their use as printing surfaces constitutes the principal object and purpose of the invention. Other objects and purposes will become apparent in the ensuing description.

DESCRIPTION OF THE INVENTION AND THE PREFERRED EMBODIMENTS

In accordance with the present invention, polymeric images are formed by applying a heat pattern to a cured allylic resin layer coated on a base plate whereby the resin layer is removed in the heated areas. Apparently the heat decomposes the resin into lower molecular weight fragments which vaporize or diffuse away from the base. A depolymerization process may be involved with concomitant regeneration of the original monomers. In any event, the overall effect is the removal of the resin layer in those areas subjected to the heat treatment. This results in a polymeric image of the cured resin bonded to the base plate. Since it is produced in the unexposed areas, such images are positive.

The polymeric images as contemplated herein are eminently suitable as printing surfaces. They are exceedingly tough and durable and highly receptable to printing inks. They are particularly adaptable to the production of planographic printing plates. I have, for instance, prepared planographic printing plates by coating an aluminum base plate with a mixture of uncured allylic resin and peroxide, curing the resulting coating, and exposing it to a heat pattern as above described to form a polymeric image and then desensitizing the aluminum surface in the exposed areas where the resin has been removed. The resulting plate is then inked and printed copies made therefrom using an offset printing press or any of the devices or procedures common to the photomechanical arts.

The rather surprising aspect of the invention is the smooth and even removal of the cured resin layer in the areas exposed to the heat pattern. The image and non-image areas are sharply delineated and clear and distinct prints can be produced therefrom. Moreover, the highly rugged and tough properties of the cured polymeric images make for unusually long press life; an advantage not realizable with the less durable known photocured polymeric images.

Various sources of heat patterns are utilizable in forming the polymeric images of the invention. Thus, a dark or black stencil can be laid over the coating and then placed under a radiant heat source such as infra red radiation. The radiation causes the dark stencil to absorb heat and this, in turn, destroys that portion of the cured resin covered by the stencil. Another source of heat pattern is a laser beam which can be directed or focused on the resin coating to effect removal in the contacted areas. The laser passes through the essentially light-transparent allylic resin and generates heat images in the support plate where it absorbs the laser. Efficient absorption is effected by applying to the upper surface of the base plate, a color or dye which is complementary to the laser wave length. The resin coating above the heat images is broken down and vaporized away. In general any type of modulated heat or thermal pattern can be applied to the production of polymeric images provided the heat is sufficiently intense to decompose or otherwise remove the cured resin layer.

The cured allylic resin coatings are obtained by applying a crosslinkable allylic resin, usually dissolved in a solvent, to a base support and then heat curing. The curing process is accelerated by the presence of peroxide catalysts which also result in a more durable polymer than the plates which are simply heat treated to effect curing. The crosslinkable allylic resins used herein are formed by the polymerization of an additional polymerizable allyl carboxylic ester having a plurality of ehtylenically unsaturated linkages at least one of which is an allyl ester group.

Exemplary crosslinkable allylic resin systems are enumerated in the following list:

(a) Prepolymers derived from allyl esters of unsaturated monobasic acids having either the general formula $C_nH_{2n-1}COOR$ or $C_nH_{2n-1-y}X_yCOOR$, such as allyl acrylate, allyl chloroacrylate, allyl methacrylate, allyl crotonate, allyl cinnamate, allyl cinnamalacetate, allyl furoate, and allyl furfurylacrylate. It is to be understood that in all formulas used herein, R is an allyl group, *n* can be any integer from 1 to 17 inclusive, except where the acid is unsaturated in which case *n* is 2 to 17, *y* is 1 or 2, and X is a halogen, hydroxyl, phenyl, substituted phenyl or furfuryl group or an alkyl or alkoxy group having 1–4 carbon atoms.

(b) Precopolymers of allyl esters of unsaturated monobasic acids; such as allyl methacrylate with butadiene, allyl methacrylate with methyl methacrylate, allyl methacrylate with styrene, allyl methacrylate with vinylidene chloride, allyl crotonate with methyl methacrylate, allyl crotonate with styrene, allyl crotonate with vinyl chloride, allyl crotonate with vinyl acetate, allyl crotonate with vinylidene chloride, allyl crotonate with diethyleneglycol maleate, allyl cinnamate with vinylidene chloride, allyl cinnamate with styrene, allyl cinnamate with cinnamyl cinnamate, allyl furoate with styrene and allyl furoate with vinylidene chloride.

(c) Prepolymers derived from allyl esters of aliphatic carboxylic acids having two or more allyl groups and having one of the following general formulas:

$$C_nH_{2n}(COOR)_2,\ C_nH_{2n-1}(COOR)_3$$

$$C_nH_{2n-y}X_y(COOR)_2,\ C_nH_{2n-1-y}X_y(COOR)_3$$

$$C_nH_{2n-2}(COOR)_2,\ C_nH_{2n-2-y}X_y(COOR)_2$$

or $$ROOCOR$$

such as diallyl oxalate, diallyl malonate, diallyl succinate, diallyl sebacate, diallyl maleate, diallyl fumarate, diallyl itaconate diallyl tartrate, diallyl carbonate, diallyl adipate, triallyl citrate, triallyl carballylate, diallyl malate and diallyl citraconate.

(d) Precopolymers of allyl esters of aliphatic carboxylic acids having two or more allyl groups; such as diallyl oxalate with vinylidene chloride, diallyl oxalate with styrene, diallyl malonate with vinylidene chloride, diallyl succinate with vinylacetate, diallyl succinate with vinylidene chloride, diallyl succinate with polyvinyl acetate, diallyl adipate with vinylidene chloride, diallyl sebacate with vinylidene chloride, diallyl maleate with methyl methacrylate, diallyl maleate with styrene, diallyl maleate with vinylidene chloride, and diallyl carbonate with methyl methacrylate.

In the aromatic and heterocyclic series are those crosslinkable copolymer resins derived from an allyl ester in which the acid is normally of the benzene, naphthalene and cyanuric acid series, typical monomers being diallyl isophthalate, diallyl terephthalate, diallyl orthophthalate, triallyl cyanurate, triallyl mellitate, tetraallyl pyromellitate and the like.

In the manufacture of crosslinkable allyl resins, also known as prepolymers, the monomeric materials are polymerized in the conventional fashion to produce a solution of a soluble polymer in the monomer to the point short of gelation which occurs when the molecular weight of the polymer approaches that point where it becomes insoluble in the monomer. These polymer solutions, or dopes, are then separated into a solvent-soluble prepolymer fraction and a monomer fraction. This is effected by treatment with a solvent which dissolves the monomer while precipitating the polymerized portion or by other means which will leave a soluble prepolymer substantially free of monomer. A typical method for separating such crosslinkable prepolymers is described in U.S. Pat. 3,030,341.

The crosslinkable allyl resins are desirably cured using a catalyst peroxide and in this connection reference is made to hydrogen peroxide, aliphatic hydroperoxides, i.e., methyl hydroperoxide, ethyl hydroperoxide, t-butyl hydroperoxide, hexyl hydroperoxide, octyl hydroperoxide, transdecalin hydroperoxide, 1-methylcyclopentyl hydroperoxide, 1,1-dimethyl-2-propenyl hydroperoxide, 2-cyclohexene-1-yl hydroperoxide, cumene hydroperoxide, tetralin hydroperoxide, triphenyl-methyl hydroperoxide, etc.; peroxide of the formula ROOR′ wherein R and R′, which may or may not be alike, can be alkyl such as methyl, ethyl, propyl, butyl, pentyl, hexyl, octyl, nonyl, decyl, undecyl, etc.; aralkyl, i.e., benzyl, phenethyl, phenylpropyl, naphthylethyl, naphthylmethyl, naphthylpropyl, etc.; aryl such as phenyl, naphthyl, etc.; aliphatic acyl such as acetyl, propionyl, butyryl, valeryl, etc.; aromatic acyl such as benzoyl, naphthoyl, etc.; peroxy acids, i.e., aliphatic peroxy acids, e.g., peracetic acid, perpropionic acid, perbutyric acid, etc.; aromatic peroxy acids, i.e., perbenzoic acid, perphthalic acid, etc.; esters of the aforesaid peroxy acids; salts of peracids such as ammonium persulfate, etc. Such compounds are well known and their description and preparation can be found in the chemical literature. An especially informative treatise is the well-known "Organic Peroxides," by Arthur B. Toblsky and Robert B. Mesrobian, and published by Interscience Publishers, Inc., New York, and Interscience Publishers, Ltd., London (1954).

Any suitable amount of catalyst may be used but, in general, it is used in the range of about 0.1 to about 6.0% by weight of the whole; dicumyl peroxide, tert.-butyl perbenzoate and tert.-butyl hydroperoxide are preferred examples.

To produce a lithographic printing plate, a mixture of peroxide catalyst and crosslinkable allylic resin is coated on a metal base plate such as aluminum or chromium plated steel or other oleophobic metal and the resin cured. After exposure to a heat pattern, the resulting plate is desensitized to render the bared aluminum areas hydrophilic after which the plate is inked and printed copies made therefrom. We have found it preferable to use aluminum sheet since it is relatively inexpensive, has the requisite structural rigidity and is readily densensitized to present a non-inking or oleophobic surface. Those skilled in the art will select that particular combination of base materials which best suits their own particular needs.

What is claimed is:

1. The method of making a planographic printing plate which comprises (1) applying to a hydrophilic metal substrate a layer of a thermally crosslinkable allyl resin obtained by the polymerization of an addition polymerizable allyl carboxylic ester having a plurality of aliphatic ethylenically unsaturated linkages at least one of which is an allyl ester group; (2) heat curing the resin layer; (3) exposing said layer to a heat pattern thereby effecting removal of the cured resin in the heated areas while leaving an image of cured resin in the unheated areas and (4) desensitizing the bared non-image areas.

2. The method of claim 1 wherein the base is aluminum.

3. The method of claim 2 wherein the allyl resin is a diallyl phthalate prepolymer.

4. The method of forming polymeric images which comprises (1) applying to a hydrophilic substrate a layer of a thermally crosslinkable allyl resin obtained by the polymerization of an addition polymerizable allyl carboxylic ester having a plurality of aliphatic ethylenically unsaturated linkages at least one of which is an allyl ester group; (2) heat curing the resin layer and (3) exposing said layer to a heat pattern thereby effecting removal of the cured resin in the heated areas while leaving an image of cured resin in the unheated areas.

References Cited

UNITED STATES PATENTS

| | | | |
|---|---|---|---|
| 2,804,388 | 8/1957 | Marron | 101—457 |
| 3,156,183 | 11/1964 | Bach | 101—467 |
| 3,452,676 | 7/1969 | Newman | 101—467 |

WILLIAM D. MARTIN, Primary Examiner

W. R. TRENOR, Assistant Examiner

U.S. Cl. X.R.

96—33, 36.3; 101—465, 467; 117—8.5, 93.31, 132